(12) United States Patent
Kim et al.

(10) Patent No.: US 9,136,445 B2
(45) Date of Patent: Sep. 15, 2015

(54) LIGHT EMITTING DEVICE CHIP, LIGHT EMITTING DEVICE PACKAGE

(75) Inventors: Yu Dong Kim, Seoul (KR); Kyoung Woo Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 234 days.

(21) Appl. No.: 13/006,097

(22) Filed: Jan. 13, 2011

(65) Prior Publication Data

US 2011/0169028 A1    Jul. 14, 2011

(30) Foreign Application Priority Data

Jan. 14, 2010 (KR) ........................ 10-2010-0003544

(51) Int. Cl.
- H01L 33/00 (2010.01)
- H01J 1/62 (2006.01)
- H01L 33/50 (2010.01)
- H01L 33/64 (2010.01)

(52) U.S. Cl.
CPC ............ H01L 33/508 (2013.01); H01L 33/507 (2013.01); *H01L 33/64* (2013.01); *H01L 2224/48091* (2013.01); *H01L 2224/48247* (2013.01)

(58) Field of Classification Search
USPC ............................................. 257/98, E33.068
See application file for complete search history.

(56) References Cited

U.S. PATENT DOCUMENTS

| | | | |
|---|---|---|---|
| 6,255,129 B1 * | 7/2001 | Lin ................................. | 438/26 |
| 6,472,765 B1 | 10/2002 | Sano et al. | |
| 6,522,065 B1 * | 2/2003 | Srivastava et al. ............ | 313/503 |
| 6,570,322 B1 * | 5/2003 | Rasmussen .................... | 313/496 |
| 6,956,247 B1 | 10/2005 | Stockman | |
| 6,987,613 B2 * | 1/2006 | Pocius et al. .................. | 359/565 |
| 7,049,159 B2 * | 5/2006 | Lowery ........................... | 438/22 |
| 7,182,481 B2 * | 2/2007 | Shimura ........................ | 362/244 |
| 7,750,362 B2 | 7/2010 | Chang Chien et al. | |
| 7,884,376 B2 | 2/2011 | Lu et al. | |
| 7,901,592 B2 * | 3/2011 | Schmidt et al. ......... | 252/301.4 F |
| 7,915,627 B2 * | 3/2011 | Li .................................... | 257/98 |

(Continued)

FOREIGN PATENT DOCUMENTS

| CN | 101532636 A | 9/2009 |
|---|---|---|
| CN | 101546795 A | 9/2009 |

(Continued)

OTHER PUBLICATIONS

Korean Office Action issued in 10-2010-0003544.

(Continued)

*Primary Examiner* — Brett Feeney
*Assistant Examiner* — Tsz Chiu
(74) *Attorney, Agent, or Firm* — Birch, Stewart, Kolasch & Birch, LLP

(57) ABSTRACT

Disclosed are a light emitting device chip, a light emitting device package, and a lighting system. The light emitting device chip includes a light emitting structure including a first conductive semiconductor layer, a second conductive semiconductor layer and an active layer interposed between the first and second conductive semiconductor layers; a transmittive layer on the light emitting structure; and a luminescence material layer on the transmittive layer, wherein the luminescence material layer includes a pattern, which does not expose the transmittive layer, partially exposes the transmittive layer or partially exposes the transmittive layer and the light emitting structure.

18 Claims, 8 Drawing Sheets

(56) References Cited

U.S. PATENT DOCUMENTS

| | | | |
|---|---|---|---|
| 8,926,114 B2 * | 1/2015 | Park et al. ............... 362/97.3 |
| 2004/0097006 A1 | 5/2004 | Lowery |
| 2006/0258028 A1 * | 11/2006 | Paolini et al. ............... 438/22 |
| 2007/0102721 A1 * | 5/2007 | DenBaars et al. ............ 257/98 |
| 2008/0157110 A1 * | 7/2008 | Huang et al. ............... 257/98 |
| 2009/0032827 A1 * | 2/2009 | Smits ............... 257/89 |
| 2009/0072263 A1 * | 3/2009 | Paolini et al. ............... 257/98 |
| 2009/0101930 A1 | 4/2009 | Li |
| 2009/0012657 A1 | 5/2009 | Wang |
| 2011/0062469 A1 * | 3/2011 | Camras et al. ............... 257/98 |
| 2011/0198619 A1 * | 8/2011 | Chiang et al. ............... 257/88 |

FOREIGN PATENT DOCUMENTS

| | | |
|---|---|---|
| EP | 1198016 A2 | 4/2002 |
| EP | 200910640 A | 3/2009 |
| JP | 2000-22216 A | 1/2000 |
| JP | 2001-135861 A | 5/2001 |
| JP | 2002-185048 A | 6/2002 |
| JP | 2005-191197 A | 7/2005 |
| JP | 2005-340850 A | 12/2005 |
| JP | 2006-278567 A | 10/2006 |
| JP | 2007-35802 A | 2/2007 |
| JP | 2007-109948 A | 4/2007 |
| JP | 2008-53069 A | 3/2008 |
| JP | 2009-43764 A | 2/2009 |
| KR | 2002-0029611 A | 4/2002 |
| KR | 10-2008-0070414 A | 7/2008 |
| KR | 10-2009-0080217 A | 7/2009 |
| KR | 10-2009-0123817 A | 12/2009 |
| TW | 541719 B | 11/2003 |
| WO | WO 2009/005311 A2 | 1/2009 |

OTHER PUBLICATIONS

A full English-language translation is enclosed herewith for JP 2005-340850 A.

Wiesmann et al., "Photonic crystal LEDs—designing light extraction," Laser & Photonics Reviews, vol. 3, No. 3, 2009 (published online: Dec. 29, 2008), pp. 262-286, XP055125552.

* cited by examiner

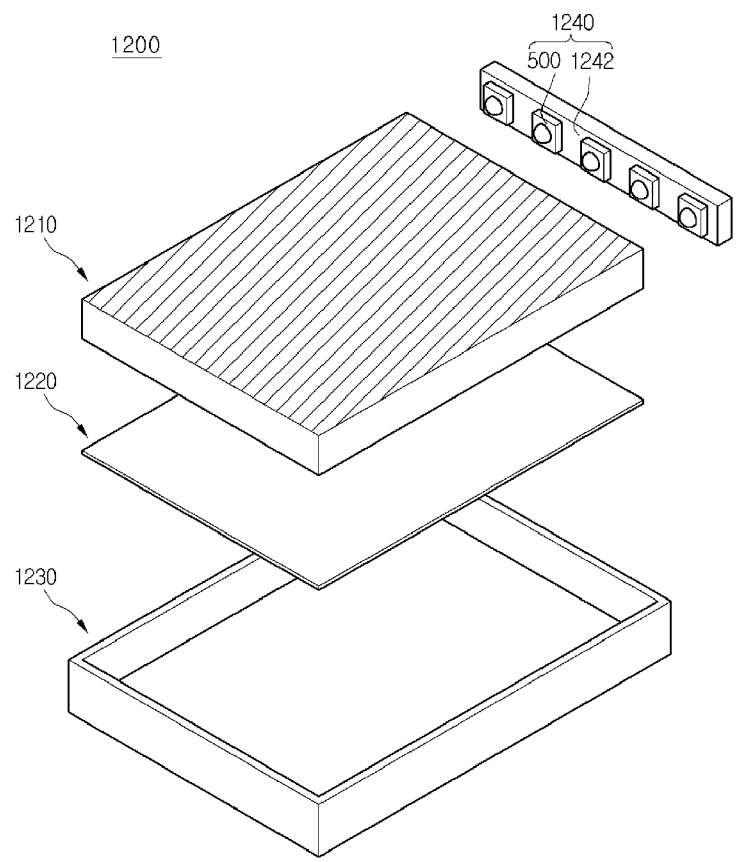

LIGHT EMITTING DEVICE CHIP, LIGHT EMITTING DEVICE PACKAGE

CROSS-REFERENCE TO RELATED APPLICATION

This application claims priority of Korean Patent Application No. 10-2010-0003544 Filed Jan. 14, 2010, which is hereby incorporated by reference.

BACKGROUND

The embodiment relates to a light emitting device chip, a light emitting device package, and a lighting system.

A light emitting device includes a p-n junction diode having a characteristic of converting electric energy into light energy. The p-n junction diode can be formed by combining group III-V elements of the periodic table. The light emitting device can represent various colors by adjusting the compositional ratio of compound semiconductors.

Meanwhile, in order to realize a white light emitting device package, light emitting devices representing red, green and blue colors, which are three primary colors of light, are combined with each other, the yellow luminescence material (YAG or TAG) is added to the blue light emitting device, or red/green/blue luminescence materials are employed in the UV light emitting device.

Meanwhile, according to the white light emitting device package using the luminescence materials of the related art, a light emitting device chip is positioned on a bottom surface of a reflective cup, an encapsulating material mixed with the luminescence material is filled in the reflective cup, and the white light is formed by mixing the light having a first wavelength generated from the light emitting device chip with the light colliding with the luminescence material and having a wavelength longer than the first wavelength.

However, according to the related art, the luminescence material mixed with the encapsulating material is filled in the reflective cup, so the reflective cup must be provided in the package.

In addition, according to the related art, the light emitting device is adjacent to a luminescence material layer, so heat generated from the light emitting device is transferred to the luminescence material layer, thereby degrading the wavelength conversion efficiency of the luminescence material layer.

Further, according to the related art, particles of the luminescence material may sink during the process, so the concentration of the luminescence material may vary depending on the process time.

In addition, according to the related art, the color temperature variation may occur depending on the viewing angles.

BRIEF SUMMARY

The embodiment provides a light emitting device chip, which can spontaneously generate white light by providing a luminescence material layer on a light emitting surface, a light emitting device package, and a lighting system.

A light emitting device chip according to the embodiment may include a light emitting structure including a first conductive semiconductor layer, a second conductive semiconductor layer and an active layer interposed between the first and second conductive semiconductor layers; a transmittive layer on the light emitting structure; and a luminescence material layer on the transmittive layer, wherein the luminescence material layer includes a pattern, which does not expose the transmittive layer, partially exposes the transmittive layer or partially exposes the transmittive layer and the light emitting structure.

A light emitting device chip according to the embodiment may include a light emitting structure including a first conductive semiconductor layer, a second conductive semiconductor layer and an active layer interposed between the first and second conductive semiconductor layers; a transmittive layer on the light emitting structure; and a luminescence material layer on the transmittive layer, wherein the transmittive layer is formed on a top surface and lateral sides of the light emitting structure.

In addition, a light emitting device package according to the embodiment may include a package body; at least one electrode layer on the package body; and the light emitting device and electrically connected to the electrode layer.

In addition, a lighting system according to the embodiment may include a light emitting module including a substrate and a light emitting device package on the substrate, wherein the light emitting device package includes a package body, third and fourth electrode layers on the package body and a light emitting device package electrically connected to the third and fourth electrode layers.

BRIEF DESCRIPTION OF THE DRAWINGS

FIG. 12 is an exploded perspective view showing a backlight unit according to the embodiment.

DETAILED DESCRIPTION OF THE EMBODIMENTS

Hereinafter, a light emitting device chip, a light emitting device package, and a lighting system according to the embodiments will be described in detail with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiments)

Figure 1:
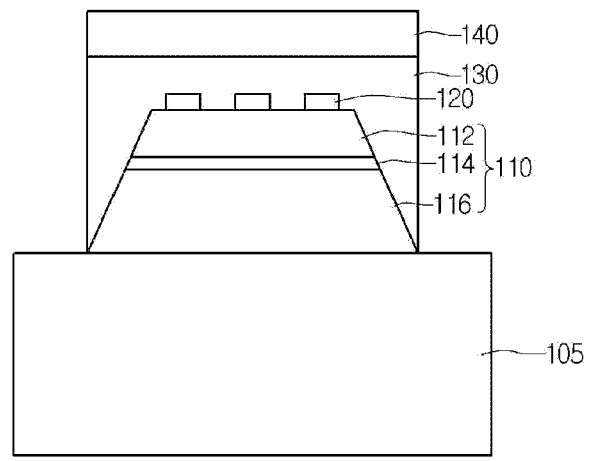
FIG. 1 is a sectional view showing a light emitting device chip according to the first embodiment.

FIG. 1 is a sectional view showing a light emitting device chip according to the first embodiment.

The light emitting device 100 according to the embodiment may include a light emitting structure 110, a transmittive layer 130 on the light emitting structure 110 and a luminescence material layer 140 on the transmittive layer 130.

According to the light emitting device chip of the embodiment, the luminescence material layer 140 may be provided in the light emitting device chip, so that the light emitting device chip can spontaneously generate white light.

According to the embodiment, the transmittive layer 130 may have lower thermal conductivity and higher light transmittive property than the luminescence material layer 140.

In addition, according to the embodiment, the transmittive layer 130 having low thermal conductivity and high light transmittive property may be interposed between a light emitting surface of the light emitting device chip and the luminescence material layer 140, so that heat generated from the light emitting surface of the light emitting structure 110 can be restricted from being transferred to the luminescence material layer 140, thereby improving the wavelength conversion efficiency of the luminescence material.

The transmittive layer 130 may include silicon gel, but the embodiment is not limited thereto.

The transmittive layer 130 may have a thickness of about 2 μm to 200 μm, but the embodiment is not limited thereto. For instance, the transmittive layer 130 may have a thickness of about 2 μm or above thicker than a first electrode 120 formed on the light emitting structure 110, but the embodiment is not limited thereto. In addition, the transmittive layer 130 may have a thickness of about 200 μm or below corresponding to the half of the total height of the light emitting device chip, but the embodiment is not limited thereto.

The transmittive layer 130 may be formed on a top surface and a lateral side of the light emitting structure 110, but the embodiment is not limited thereto. For instance, the transmittive layer 130 may be exclusively formed on the top surface or the lateral side of the light emitting structure 110.

The luminescence material layer 140 may have a thickness of about 5 μm to 500 μm, but the embodiment is not limited thereto. For instance, the luminescence material layer 140 may have a thickness of about 5 μm or above to convert blue light into yellow light or may have a thickness of about 500 μm or below by taking the size of the light emitting device chip into consideration, but the embodiment is not limited thereto.

According to the embodiment, the first electrode 120 may include a line pattern having an electric connection and a part of the first electrode 120 may be electrically connected to an exposed pad electrode (not shown).

According to the embodiment, the luminescence material layer 140 is provided in the light emitting device chip, so that the light emitting device chip can spontaneously generate white light.

According to the embodiment, a lateral width of the light emitting structure 110 may be smaller than that of the second electrode 105, but the embodiment is not limited thereto.

In addition, according to the embodiment, the heat generated from the light emitting device chip can be restricted from being transferred to the luminescence material layer 140, thereby improving the wavelength conversion efficiency of the luminescence material layer 140.

Hereinafter, the method for manufacturing the light emitting device chip according to the first embodiment will be described with reference to FIGS. 2 to 5.

Figure 2:
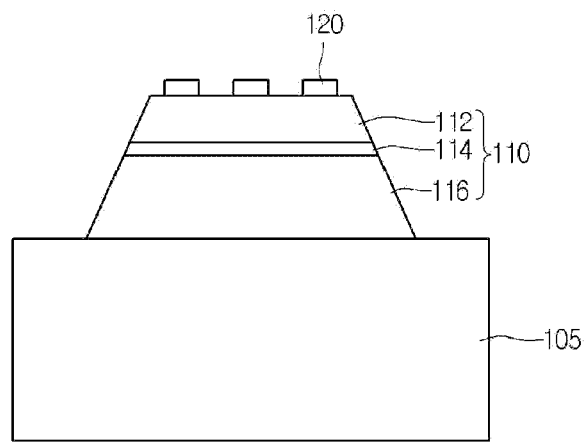
FIGS. 2 to 5 are sectional views showing a method for manufacturing a light emitting device chip according to the first embodiment.

As shown in FIG. 2, the light emitting device chip according to the first embodiment may include the light emitting structure 110 formed on the second electrode 105. The second electrode 105 may include at least one of an ohmic layer, a reflective layer, a bonding layer and a conductive substrate.

The light emitting structure 110 may include a second conductive semiconductor layer 116, an active layer 114 and a first conductive semiconductor layer 112.

Hereinafter, the method of forming the light emitting structure 110 on the second electrode 105 will be described.

First, a first substrate (not shown) is prepared. The first substrate may include a sapphire substrate or a SiC substrate, but the embodiment is not limited thereto.

Then, the light emitting structure 110 including the first conductive semiconductor layer 112, the active layer 114 and the second conductive semiconductor layer 116 is formed on the first substrate.

The first conductive semiconductor layer 112 may include at least one selected from the group consisting of GaN, InN, AlN, InGaN, AlGaN, InAlGaN, AlInN, AlGaAs, InGaAs, AlInGaAs, GaP, AlGaP, InGaP, AlInGaP, InP.

The first conductive semiconductor layer 112 may include an N type GaN layer, which is formed through the CVD, MBE, sputtering or HYPE. In addition, the first conductive semiconductor layer 112 can be formed by injecting trimethyl gallium (TMGa) gas, ammonia ($NH_3$) gas, nitrogen ($N_2$) gas and silane ($SiH_4$) gas including n type impurities, such as silicon, into the chamber.

According to the embodiment, an undoped semiconductor layer (not shown) is formed on the first substrate (not shown) and the first conductive semiconductor layer 112 is formed on the undoped semiconductor layer in order to attenuate the lattice mismatch between the first substrate and the light emitting structure.

The active layer 114 may include at least one of a single quantum well structure, a multiple quantum well (MQW) structure, a quantum wire structure or a quantum dot structure. For instance, the active layer 114 can be formed with the MQW structure by injecting TMGa gas, $NH_3$ gas, $N_2$ gas, and trimethyl indium (TMIn) gas, but the embodiment is not limited thereto.

The active layer 114 may have a well/barrier layer including at least one of InGaN/GaN, InGaN/InGaN, AlGaN/GaN, InAlGaN/GaN, GaAs/AlGaAs (InGaAs) and GaP/AlGaP (InGaP), but the embodiment is not limited thereto. The well layer may include a material having the band gap energy lower than that of the barrier layer.

The conductive clad layer can be formed on and/or under the active layer 114. The conductive clad layer may include an AlGaN-based semiconductor having the band gap energy higher than that of the active layer 114.

The second conductive semiconductor layer 116 includes the group III-V compound semiconductor doped with the second conductive dopant. For instance, the second conductive semiconductor layer 116 may include the semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 116 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 116 is a P type semiconductor layer, the second conductive dopant includes the P type dopant such as Mg, Zn, Ca, Sr, or Ba. The second conductive semiconductor layer 116 can be prepared as a single layer or a multiple layer, but the embodiment is not limited thereto.

The second conductive semiconductor layer 116 may include a p type GaN layer, which can be formed by injecting TMGa gas, $NH_3$ gas, $N_2$ gas and ($EtCp_2Mg$) {Mg ($C_2H_5C_5H_4)_2$} gas including p type impurities (for example, Mg) into the chamber, but the embodiment is not limited thereto.

According to the embodiment, the first conductive semiconductor layer 112 may include an N type semiconductor layer and the second conductive semiconductor layer 116 may include a P type semiconductor layer, but the embodiment is not limited thereto. In addition, a semiconductor layer, such as an N type semiconductor layer (not shown) having polarity opposite to that of the second conductive semiconductor layer 116, can be formed on the second conductive semiconductor layer 116. Thus, the light emitting structure 110 may include one of an N-P junction structure, a P-N junction structure, an N-P-N junction structure, and a P-N-P junction structure.

After that, the second electrode 105 is formed on the second conductive semiconductor layer 116.

The second electrode 105 may include an ohmic layer (not shown), a reflective layer (not shown), a bonding layer (not shown) and a second substrate (not shown). The second electrode 105 may include at least one of Ti, Cr, Ni, Al, Pt, Au, W, Mo and a semiconductor substrate doped with impurities.

For instance, the second electrode 105 may include the ohmic layer. In this case, the ohmic layer can be prepared as a multiple layer by stacking single metal, a metal alloy, and metal oxide in order to facilitate the hole injection. For instance, the ohmic layer may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO nitride) , AGZO (Al—Ga ZnO), IGZO (In—GaZnO), ZnO, IrOx, RuOx, NiO, RuOx/ITO, Ni/IrOx/ Au, Ni/IrOx/Au/ITO, Ag, Ni, Cr, Ti, Al, Rh, Pd, Ir, Ru, Mg, Zn, Pt, Au, and Hf, but the embodiment is not limited thereto.

When the second electrode 105 includes the reflective layer, the reflective layer may include a metal or a metal alloy including at least one selected from the group consisting of Ag, Ni, Al, Rh, Pd, Ir, Ru, Mg, Zn, Pt, Au and Hf. In addition, the reflective layer can be prepared as a multiple layer by using the above metal or metal alloy and transmissive conductive material, such as IZO, IZTO, IAZO, IGZO, IGTO, AZO, or ATO. For instance, the reflective layer may have the stack structure including IZO/Ni, AZO/Ag, IZO/Ag/Ni, or AZO/Ag/Ni.

In addition, if the second electrode layer 120 includes the bonding layer, the reflective layer may serve as the bonding layer or the bonding layer may include at least one selected from the group consisting of Ti, Au, Sn, Ni, Cr, Ga, In, Bi, Cu, Ag and Ta.

In addition, the second electrode 105 may include the second substrate. The second substrate may include a metal having superior electric conductivity, a metal alloy or conductive semiconductor material in order to facilitate the hole injection. For instance, the second substrate may include at least one selected from the group consisting of Cu, a Cu alloy, Au, Ni, Mo, Cu—W, and a carrier wafer, such as Si, Ge, GaAs, GaN, ZnO, SiGe, and SiC wafers.

The second substrate can be formed through the electrochemical metal deposition scheme or the bonding scheme using a eutectic metal.

Then, the first substrate is removed such that the first conductive semiconductor layer 112 can be exposed. The first substrate can be removed through the laser lift off scheme or the chemical lift off scheme. In addition, the first substrate can be removed by physically grinding the first substrate.

Thus, the light emitting structure 110 can be formed on the second electrode 105 shown in FIG. 1.

After the first substrate has been removed, the etching process can be performed with respect to the light emitting structure 110 such that the light emitting structure 110 may have an inclined inner sidewall, but the embodiment is not limited thereto.

Then, the first electrode 120 is formed on the light emitting structure 110. The first electrode 120 may include the line pattern having the electric connection. The first electrode 120 can be electrically connected to the pad electrode (not shown).

Figure 3:
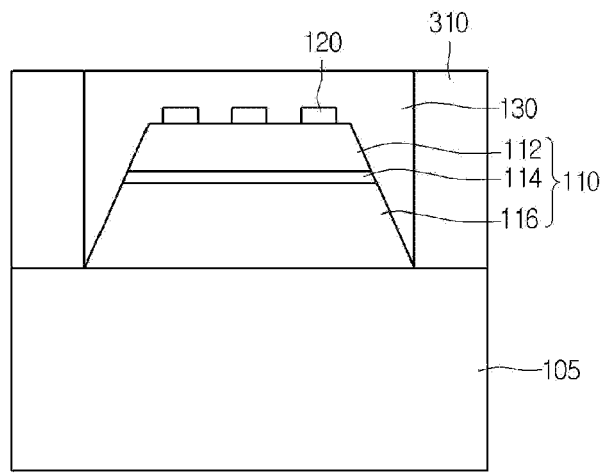

After that, as shown in FIG. 3, the transmittive layer 130 is formed on the light emitting structure 110.

For instance, a first pattern 310 is formed at a lateral side of the light emitting structure 110 and the transmittive layer 130 is formed by using the first pattern 310 as a barrier.

The transmittive layer 130 may have a thickness of about 2 μm to 200 μm but the embodiment is not limited thereto. For instance, the transmittive layer 130 may have a thickness of about 2 μm or above thicker than THE first electrode 120 formed on the light emitting structure 110, but the embodiment is not limited thereto. In addition, the transmittive layer 130 may have a thickness of about 200 μm or below corresponding to the half of the total height of the light emitting device chip, but the embodiment is not limited thereto.

The transmittive layer 130 may include silicone gel, but the embodiment is not limited thereto.

According to the embodiment, the transmittive layer 130 having low thermal conductivity and high light transmittive property is interposed between the light emitting surface of the light emitting device chip and the luminescence material layer 140, so that the heat generated from the light emitting surface of the light emitting structure 110 can be restricted from being transferred to the luminescence material layer 140, thereby improving the wavelength conversion efficiency of the luminescence material.

Figure 4:
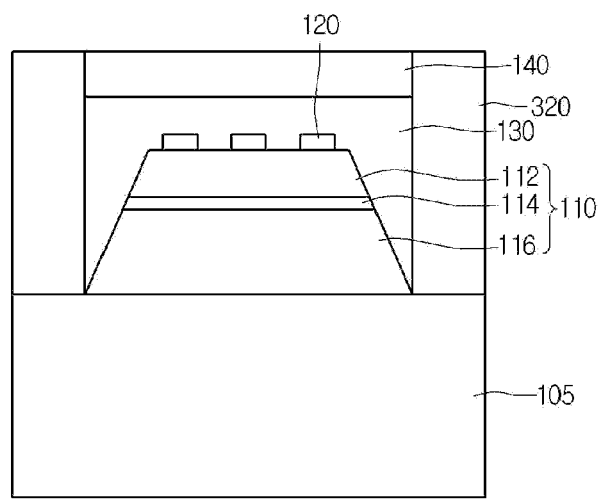

Then, as shown in FIG. 4, the first pattern 310 may be removed and a second pattern 320 may be formed. After that, the luminescence material layer 140 may be formed on the transmittive layer 130 by using the second pattern 320 as a barrier.

The luminescence material layer 140 may have a thickness of about 5 μm to 500 μm, but the embodiment is not limited thereto. For instance, the luminescence material layer 140 may have a thickness of about 5 μm or above to convert blue light into yellow light or may have a thickness of about 500 μm or below by taking the size of the light emitting device chip into consideration, but the embodiment is not limited thereto.

The luminescence material layer 140 may include an encapsulating material including the luminescence material to protect the chip and to improve the light extraction efficiency.

The encapsulating material may include an epoxy encapsulating material or a silicon encapsulating material, but the embodiment is not limited thereto.

The luminescence material may include a host material and an active material. For instance, the luminescence material may include the host material of yttrium aluminum garnet (YAG) or a silicate-based material and the active material of cesium (Ce) or europium (Eu), but the embodiment is not limited thereto.

In order to encapsulate the encapsulating material, dispensing, casting molding, transfer molding, vacuum printing or screen printing can be performed.

Figure 5:
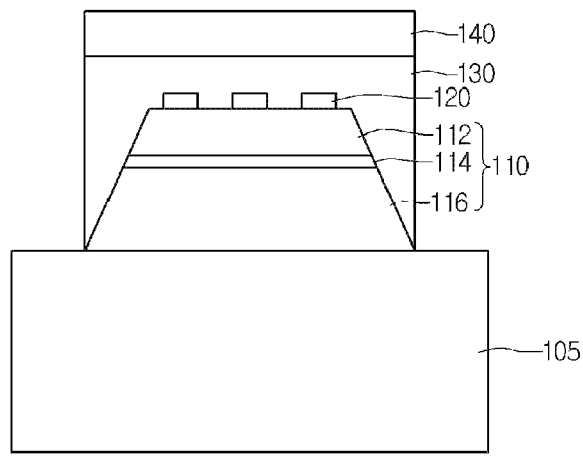

After that, as shown in FIG. 5, the second pattern 320 is removed, thereby providing the light emitting device chip 100 according to the first embodiment.

According to the light emitting device chip of the embodiment, the luminescence material layer 140 is provided in the light emitting device chip, so that the light emitting device chip can spontaneously generate white light.

In addition, according to the embodiment, the heat generated from the light emitting device chip can be restricted from being transferred to the luminescence material layer, thereby improving the wavelength conversion efficiency of the luminescence material layer.

Figure 6:
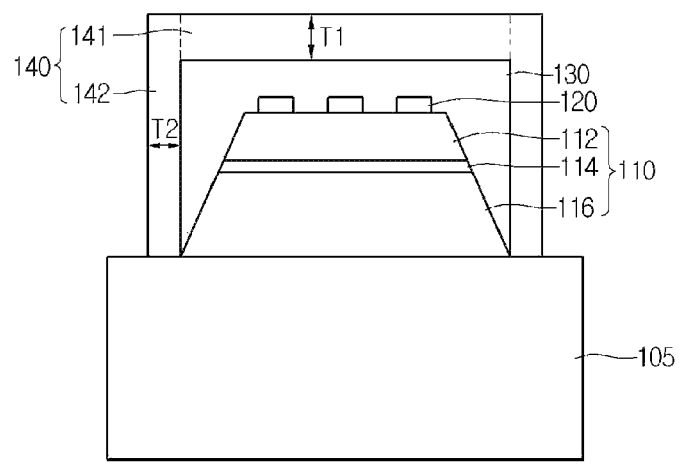
FIG. 6 is a sectional view showing a light emitting device chip according to the second embodiment.

FIG. 6 is a sectional view showing a light emitting device chip 102 according to the second embodiment.

The second embodiment may adopt the technical features of the first embodiment.

According to the second embodiment, the luminescence material layer includes a first luminescence material layer 141 formed on the transmittive layer 130 and a second luminescence material layer 142 formed on a part or a whole area of lateral sides of the light emitting structure 110. Although the second luminescence material layer 142 formed on the whole area of lateral sides of the light emitting structure 110 is shown for illustrative purpose, the embodiment is not limited thereto.

According to the second embodiment, after the transmittive layer 130 is formed, a third pattern (not shown) spaced part from the transmittive layer 130 is formed as a barrier to form the luminescence material layer 140, but the embodiment is not limited thereto.

According to the second embodiment, the proportion of light, such as blue light emitted from the light emitting surface of the light emitting device chip and extracted through the lateral side of the transmittive layer, can be adjusted, so that the optical characteristics, such as the color temperature variation depending on the viewing angles, can be controlled.

For instance, the first luminescence material layer 141 may have a first thickness T1 and the second luminescence material layer 142 may have a second thickness T2.

According to the second embodiment, the second thickness T2 is thicker than the first thickness T1 by two times or less. Although FIG. 6 shows the second thickness T2 thinner than the first thickness T1, this is illustrative purpose only. Actually, the second thickness T2 is defined as $0<T2\le 2T1$.

According to the second embodiment, the proportion of light extracted through the lateral side of the transmittive layer can be adjusted by adjusting the second thickness T2 of the second luminescence material layer 142, so that the optical characteristics, such as the color temperature variation depending on the viewing angles, can be controlled.

In addition, according to the second embodiment, the proportion of light extracted through the lateral side of the transmittive layer can be adjusted according to the proportion of the second luminescence material layer 142 formed on the part or the whole area of the lateral sides of the light emitting structure 110, so that the optical characteristics, such as the color temperature variation depending on the viewing angles, can be controlled.

Figure 7A:
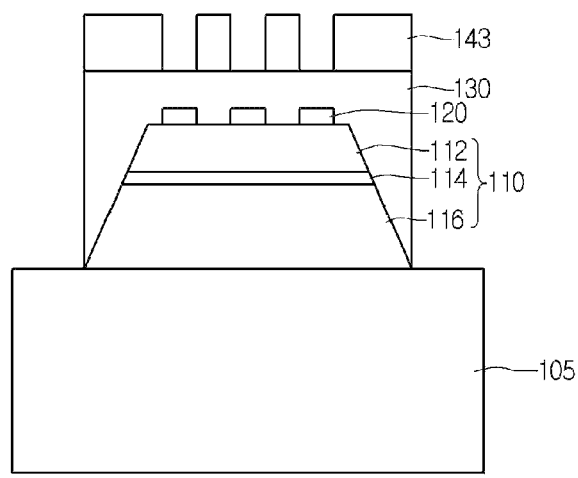
FIG. 7a is a sectional view showing a light emitting device chip according to the third embodiment.

FIG. 7a is a sectional view showing a light emitting device chip 103 according to the third embodiment.

The third embodiment may adopt the technical features of the first and second embodiments.

According to the third embodiment, a luminescence material layer 143 may include a patterned luminescence material layer.

According to the third embodiment, similar to the first embodiment, a predetermined patterning process is performed after the luminescence material layer has been formed, or the luminescence material layer is formed after a fourth pattern (not shown) has been formed and the fourth pattern is removed through the lift off scheme, but the embodiment is not limited thereto.

According to the third embodiment, the patterned luminescence material layer 143 is formed on the light emitting device chip, so that the light extraction area may be enlarged due to the patterned luminescence material layer 143, thereby improving the light extraction efficiency.

According to the third embodiment, as shown in FIG. 7a, the transmittive layer 130 may be partially exposed through the patterned luminescence material layer 143, but the embodiment is not limited thereto. In addition, the transmittive layer 130 and the light emitting structure 110 may be partially exposed through the patterned luminescence material layer 143.

In addition, according to the third embodiment, the patterned luminescence material layer 143 can also be formed on the lateral sides of the light emitting structure 110. Thus, the light emitted through the lateral sides of the light emitting structure 110 may be converted into the white light. In addition, the patterned luminescence material layer 143 may be formed on the part of the lateral sides of the light emitting structure 110, other that the whole area of the lateral sides of the light emitting structure 110, so that the color temperature of the light emitted from the light emitting device chip can be controlled by adjusting the thickness of the patterned luminescence material layer 143 formed on the lateral sides of the light emitting structure 110.

According to the third embodiment, the area of the patterned luminescence material layer 143 is adjusted within 30% to 90% based on the light emitting area of the light emitting device chip, so that the color temperature of the light emitted from the light emitting device can be controlled.

Figure 7B:
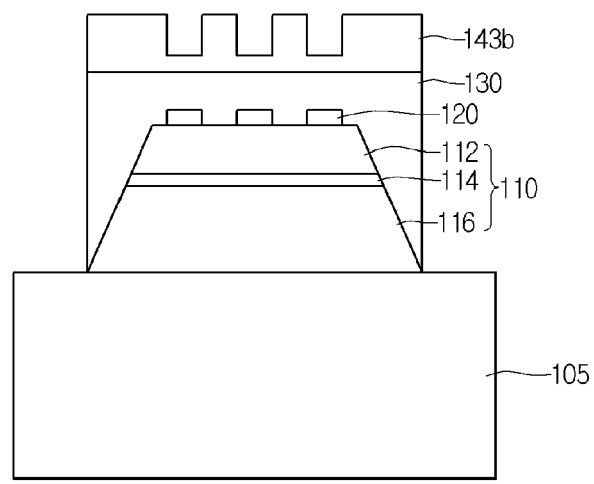
FIG. 7b is a sectional view showing a light emitting device chip according to the fourth embodiment.

FIG. 7b is a sectional view showing a light emitting device chip 104 according to the fourth embodiment.

The fourth embodiment may adopt the technical features of the first to third embodiments.

In the light emitting device chip 104 according to the fourth embodiment, a patterned luminescence material layer 143b may not expose the transmittive layer 130.

According to the fourth embodiment, the patterned luminescence material layer 143b is formed on the light emitting device chip, so that the light extraction area may be enlarged due to the patterned luminescence material layer 143b, thereby improving the light extraction efficiency.

Figure 8A:
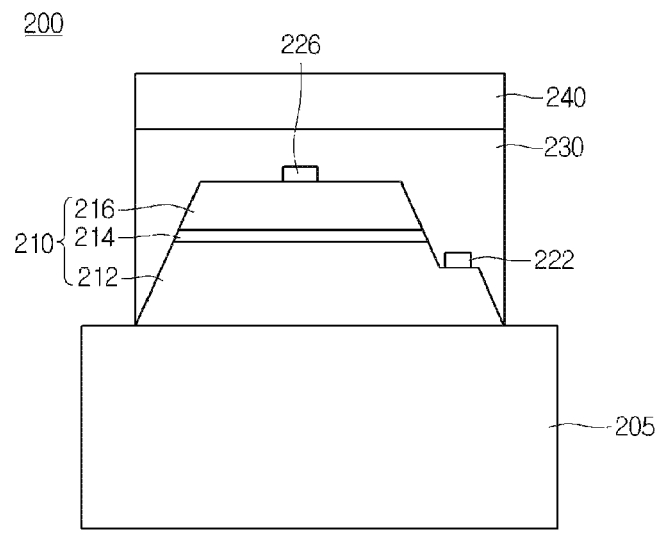
FIG. 8a is a sectional view showing a light emitting device chip according to the fifth embodiment.

FIG. 8a is a sectional view showing a light emitting device chip 200 according to the second embodiment.

The fifth embodiment is an example of a lateral type light emitting device chip and may adopt the technical features of the first to fourth embodiments.

The light emitting device chip 200 according to the fifth embodiment includes a light emitting structure 210 formed on a non-conductive substrate 205 and provided with a first conductive semiconductor layer 212, an active layer 214 and a second conductive semiconductor layer 216, a transmittive layer 230 on the light emitting structure 210, and a luminescence material layer 240 on the transmittive layer 230. A third electrode 222 is formed on the first conductive semiconductor layer 212 and a fourth electrode 226 is formed on the second conductive semiconductor layer 216.

Figure 8B:
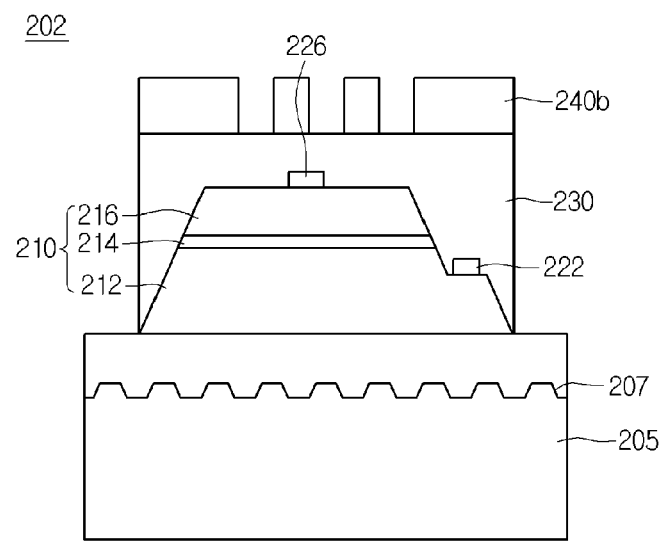
FIG. 8b is a sectional view showing a light emitting device chip according to the sixth embodiment.

FIG. 8b is a sectional view showing a light emitting device chip 202 according to the sixth embodiment.

The sixth embodiment may adopt the technical features of the first to fifth embodiments.

According to the sixth embodiment, the transmittive layer 230 maybe partially exposed through a patterned luminescence material layer 240b, but the embodiment is not limited thereto. In addition, the transmittive layer 230 and the light emitting structure 210 may be partially exposed through the patterned luminescence material layer 240b.

In addition, according to the sixth embodiment, a PSS (patterned sapphire substrate) 207 is formed on the non-conductive substrate 205 to improve the light extraction efficiency.

According to the light emitting device chip, the light emitting device package and the method of manufacturing the light emitting device chip of the embodiments, the luminescence material layer is formed in the light emitting device chip, so that the light emitting device chip can spontaneously generate the white light.

In addition, according to the embodiment, the heat generated from the light emitting device chip can be restricted from being transferred to the luminescence material layer, thereby improving the wavelength conversion efficiency of the luminescence material layer.

Further, according to the embodiment, the luminescence material layer having various shapes can be formed, so that the optical characteristics, such as the color temperature variation depending on the viewing angles, can be controlled.

In addition, according to the embodiment, the luminescence material layer is patterned on the light emitting device chip, so that the light extraction efficiency can be improved.

Figure 9:
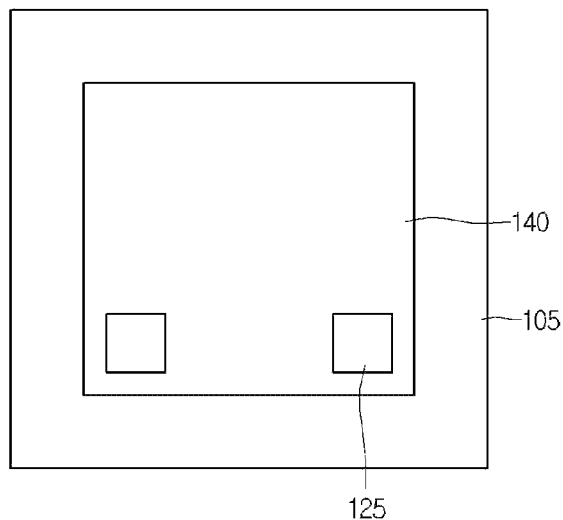
FIG. 9 is a plan view showing a light emitting device chip according to the embodiment.

FIG. 9 is a plan view showing the light emitting device chip according to the embodiment.

According to the present embodiment, the light emitting device chip further includes a pad electrode 125 electrically connected to the first electrode 120 and exposed upward of the transmittive layer 130. For instance, in the case of the vertical type light emitting device, at least two pad electrodes 125 may be provided when the light emitting device has the mass storage, but the embodiment is not limited thereto.

Figure 10:
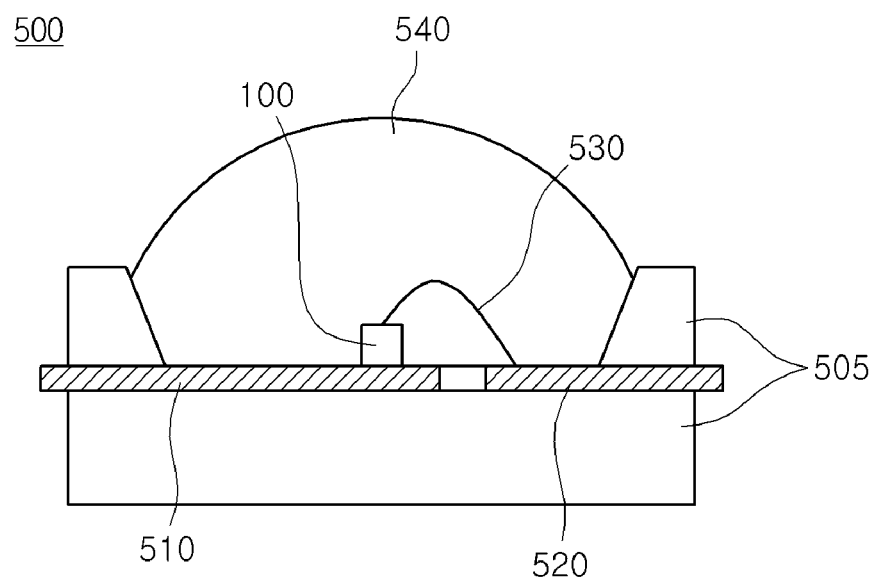
FIG. 10 is a sectional view showing a light emitting device package according to the embodiment.

FIG. 10 is a view showing a light emitting device package 500 including the light emitting device chip according to the embodiments.

The light emitting device package 500 according to the embodiment includes a package body 505, fifth and sixth electrode layers 510 and 520 formed on the package body 505, the light emitting device chip 100 provided on the package body 505 and electrically connected to the fifth and sixth electrode layers 510 and 520 and a molding member 540 that surrounds the light emitting device chip 100.

The package body 505 may include silicon, synthetic resin or a metallic material. An inclined surface may be formed around the light emitting device chip 100.

The fifth and sixth electrode layers 510 and 520 are electrically isolated from each other to supply power to the light emitting device chip 100. In addition, the fifth and sixth electrode layers 510 and 520 reflect the light emitted from the light emitting device chip 100 to improve the light efficiency and dissipate heat generated from the light emitting device chip 100 to the outside.

The light emitting device chips 100, 102, 103 and 200 according to first to fourth embodiments can be applied to the light emitting device package 500 and the light emitting device chip 100 can be installed on the package body 505 or the fifth or sixth electrode layer 510 or 520.

The light emitting device chip 100 can be electrically connected to the fifth electrode layer 510 and/or the sixth electrode layer 520 through a wire 530. Although only one wire 530 is shown in FIG. 10, the embodiment is not limited thereto. If the light emitting device chip according to the fourth embodiment is employed, a plurality of wires can be used.

The molding member 540 surrounds the light emitting device chip 100 to protect the light emitting device chip 100.

According to the light emitting device chip and the light emitting device package of the embodiment, the luminescence material layer is provided in the light emitting device chip, so that the light emitting device chip can spontaneously generate white light.

In addition, according to the embodiment, the heat generated from the light emitting device chip can be restricted from being transferred to the luminescence material layer, thereby improving the wavelength conversion efficiency of the luminescence material layer.

Further, according to the embodiment, the luminescence material layer having various shapes can be formed, so that the optical characteristics, such as the color temperature variation depending on the viewing angles, can be controlled.

In addition, according to the embodiment, the luminescence material layer is patterned on the light emitting device chip, so that the light extraction efficiency can be improved.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 11:
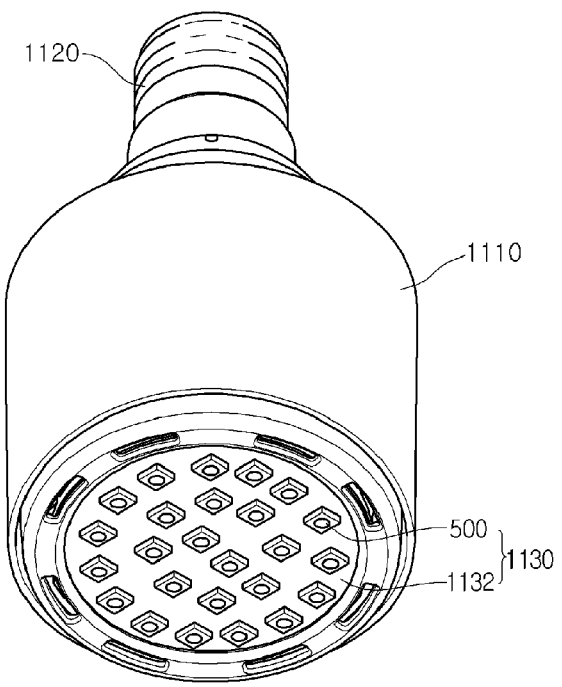
FIG. 11 is a perspective view showing a lighting unit according to the embodiment.

FIG. 11 is a perspective view showing a lighting unit 1100 according to the embodiment. The lighting unit 1100 shown in FIG. 11 is an example of a lighting system and the embodiment is not limited thereto.

Referring to FIG. 11, the lighting unit 1100 includes a case body 1110, alight emitting module 1130 installed in the case body 1110, and a connection terminal 1120 installed in the case body 1110 to receive power from an external power source.

Preferably, the case body 1110 includes a material having superior heat dissipation property. For instance, the case body 1110 includes a metallic material or a resin material.

The light emitting module 1130 may include a substrate 1132 and at least one light emitting device package 500 installed on the substrate 1132.

The substrate 1132 includes an insulating member printed with a circuit pattern. For instance, the substrate 1132 includes a PCB (printed circuit board), an MC (metal core) PCB, an F (flexible) PCB, or a ceramic PCB.

In addition, the substrate 1132 may include material that effectively reflects the light. The surface of the substrate 1132 can be coated with a color, such as a white color or a silver color, to effectively reflect the light.

At least one light emitting device package 500 can be installed on the substrate 1132. Each light emitting device package 500 may include at least one LED (light emitting diode). The LED may include a colored LED that emits the light having the color of red, green, blue or white and a UV (ultraviolet) LED that emits UV light.

The light emitting device packages 500 of the light emitting module 1130 can be variously combined to provide various colors and brightness. For instance, the white LED, the red LED and the green LED can be combined to achieve the high color rendering index (CRI).

The connection terminal 1120 is electrically connected to the light emitting module 1130 to supply power to the light emitting module 1130. Referring to FIG. 11, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

FIG. 12 is an exploded perspective view showing a backlight unit 1200 according to the embodiment. The backlight unit 1200 shown in FIG. 12 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned below the light guide plate, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to the lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 500 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 500 are arranged such that light exit surfaces of the light emitting device packages 500 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

According to the light emitting device chip, the light emitting device package and the lighting system of the embodiment, the luminescence material layer is provided in the light emitting device chip, so that the light emitting device chip can spontaneously generate white light.

In addition, according to the embodiment, the heat generated from the light emitting device chip can be restricted from being transferred to the luminescence material layer, thereby improving the wavelength conversion efficiency of the luminescence material layer.

Further, according to the embodiment, the luminescence material layer having various shapes can be formed, so that the optical characteristics, such as the color temperature variation depending on the viewing angles, can be controlled.

In addition, according to the embodiment, the luminescence material layer is patterned on the light emitting device chip, so that the light extraction efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device chip, comprising:
a light emitting structure including a first conductive semiconductor layer, a second conductive semiconductor layer and an active layer interposed between the first and second conductive semiconductor layers;
at least two first electrodes on a top surface of the light emitting structure;
a transmittive layer on the light emitting structure; and
a luminescence material layer on the transmittive layer,
wherein the luminescence material layer comprises a pattern,
wherein the luminescence material layer partially exposes both the transmittive layer and the light emitting structure,
wherein a bottom surface of the transmittive layer is disposed on a top surface of the light emitting structure,
wherein the pattern of the luminescence material layer comprises at least two holes exposing the transmittive layer,
wherein the at least two holes vertically overlap with the at least two first electrodes, and
wherein the transmittive layer has lower thermal conductivity and higher light transmittive property than the luminescence material layer.

2. The light emitting device chip of claim 1, wherein the luminescence material layer is formed on a part or a whole area of lateral sides of the light emitting structure.

3. The light emitting device chip of claim 1, wherein the transmittive layer has a thickness of about 2 μm to about 200 μm.

4. The light emitting device chip of claim 1, wherein the luminescence material layer has a thickness of about 5 μm to about 500 μm.

5. The light emitting device chip of claim 1, wherein an area of the luminescence material layer remaining after a patterning process is in a range of 30% to 90% based on a light emitting area of the light emitting device chip.

6. The light emitting device chip of claim 2, wherein the luminescence material layer at the lateral sides of the light emitting structure comprises the pattern.

7. The light emitting device chip of claim 2, wherein a thickness of the luminescence material layer at the lateral sides of the light emitting structure is thicker than a thickness of the luminescence material layer formed on the transmittive layer by two times or less.

8. The light emitting device chip of claim 1, further comprising a second electrode under the light emitting structure.

9. The light emitting device chip of claim 8, wherein a lateral width of the light emitting structure is smaller than that of the second electrode.

10. The light emitting device chip of claim 1, further comprising an electric insulation substrate under the light emitting structure.

11. A light emitting device chip, comprising:
a light emitting structure including a first conductive semiconductor layer, a second conductive semiconductor layer and an active layer interposed between the first and second conductive semiconductor layers;
a transmittive layer on the light emitting structure; and
a luminescence material layer on the transmittive layer,
wherein the transmittive layer is formed on a top surface and lateral sides of the light emitting structure,
wherein the transmittive layer has a lower thermal conductivity and a higher light transmittive property than the luminescence material layer,
wherein the luminescence material layer is disposed on a top surface and a side surface of the transmittive layer, and
wherein the luminescence material layer comprises a first luminescence material layer on the top surface of the transmittive layer and a second luminescence material layer on the side surface of the transmittive layer.

12. The light emitting device chip of claim 11, wherein the transmittive layer has a thickness of about 2 μm to about 200 μm.

13. The light emitting device chip of claim 11,
wherein the luminescence material layer comprises a pattern,
wherein the pattern of the luminescence material layer partially exposes both the transmittive layer and the light emitting structure, and
wherein a bottom surface of the transmittive layer is disposed on the top surface of the light emitting structure.

14. The light emitting device chip of claim 13, wherein the luminescence material layer has a thickness of about 5 μm to about 500 μm.

15. The light emitting device chip of claim 13, wherein an area of the luminescence material layer remaining after a patterning process is in a range of 30% to 90% based on a light emitting area of the light emitting device chip.

16. A light emitting device package comprising:
a package body;
at least one electrode layer on the package body; and
the light emitting device claimed in claim 1 and electrically connected to the electrode layer.

17. The light emitting device chip of claim 1, wherein the transmittive layer comprises silicone gel.

18. The light emitting device chip of claim 13, wherein the first luminescence material layer has a first thickness different from a second thickness of the second luminescence material layer.

* * * * *